United States Patent
Furukawa et al.

(10) Patent No.: US 7,557,023 B2
(45) Date of Patent: *Jul. 7, 2009

(54) IMPLANTATION OF GATE REGIONS IN SEMICONDUCTOR DEVICE FABRICATION

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

This patent is subject to a terminal disclaimer.

(21) Appl. No.: 11/532,189

(22) Filed: Sep. 15, 2006

(65) Prior Publication Data
US 2007/0148935 A1     Jun. 28, 2007

Related U.S. Application Data

(62) Division of application No. 10/905,977, filed on Jan. 28, 2005, now Pat. No. 7,118,997.

(51) Int. Cl.
*H01L 21/425* (2006.01)
(52) U.S. Cl. .................. 438/528; 438/289; 438/299; 438/301; 438/542; 438/558; 438/705; 438/725; 438/781
(58) Field of Classification Search .............. 438/289, 438/299, 301, 528, 542, 558, 705, 725, 781
See application file for complete search history.

(56) References Cited

U.S. PATENT DOCUMENTS

| 5,158,861 | A | 10/1992 | Tokui et al. |
|---|---|---|---|
| 5,258,266 | A | 11/1993 | Tokui et al. |
| 6,221,704 | B1 | 4/2001 | Furukawa et al. |
| 6,242,164 | B1 | 6/2001 | Choi et al. |
| 6,337,175 | B1 | 1/2002 | Yamaguchi |
| 6,686,132 | B2 | 2/2004 | Cheng et al. |
| 6,818,383 | B2 | 11/2004 | Kawai |
| 7,118,997 | B2 * | 10/2006 | Furukawa et al. ........... 438/528 |
| 2002/0197839 | A1 | 12/2002 | Dokumaci et al. |
| 2006/0006476 | A1 * | 1/2006 | Biery et al. ................. 257/382 |

\* cited by examiner

*Primary Examiner*—Kevin M Picardat
*Assistant Examiner*—Bac H Au
(74) *Attorney, Agent, or Firm*—Schmeiser, Olsen & Watts; William D. Sabo

(57) ABSTRACT

A semiconductor fabrication method. The method includes providing a semiconductor structure which includes (i) a semiconductor layer, (ii) a gate dielectric layer on the semiconductor layer, and (iii) a gate electrode region on the gate dielectric layer. The gate dielectric layer is sandwiched between and electrically insulates the semiconductor layer and the gate electrode region. The semiconductor layer and the gate dielectric layer share a common interfacing surface which defines a reference direction perpendicular to the common interfacing surface and pointing from the semiconductor layer to the gate dielectric layer. Next, a resist layer is formed on the gate dielectric layer and the gate electrode region. Next, a cap portion of the resist layer directly above the gate electrode region in the reference direction is removed without removing any portion of the resist layer not directly above the gate electrode region in the reference direction.

1 Claim, 6 Drawing Sheets

IMPLANTATION OF GATE REGIONS IN SEMICONDUCTOR DEVICE FABRICATION

This application is a divisional of Ser. No. 10/905,977, filed Jan. 28, 2005 now U.S. Pat. No. 7,118,997.

BACKGROUND OF THE INVENTION

1. Technical Field

The present invention relates to semiconductor device fabrication, and more specifically, to implantation of gate regions in semiconductor device fabrication.

2. Related Art

A conventional semiconductor device fabrication process usually starts out with the formation of shallow trench device isolation (STI) followed by a gate dielectric formation on a semiconductor layer. Next, poly-silicon gate regions are formed on the gate dielectric layer. These poly-silicon gate regions are formed thick so that later source/drain and halo implantations cannot pass through them into the channel regions. The poly-silicon gate is doped by the same source/drain implants. The dose and the energy of the implants are optimized for the shallow source/drain diffusions and thus the doping concentration of the poly-silicon gate is not sufficient to reduce the poly-silicon depletion effect, and as a result, the effective electrical thickness of gate dielectric is significantly thicker than the physical gate dielectric thickness. Reducing the effective electrical thickness is one of the key factors to improve performance of poly-silicon gate field effect transistor (FET) device. Reducing the poly-silicon depletion thickness is essential to improve device performance. Therefore, it is highly beneficial to have a method to increase the concentration of doping of the poly-silicon without disturbing the optimized source/drain diffusion doping profile. One prior art method of optimizing both source/drain doping and polysilicon gate doping is described by Dokumaci et al. in the US patent application publication, US2002/0197839A1. In this prior art, a spin-applied resist layer is formed on the entire structure and then etched back until the poly-silicon gate regions are exposed to the atmosphere. Next, gate regions implantation is performed to dope the gate regions. It is desirable that the spin-applied resist layer after being etched back is still thick enough to prevent the gate regions implantation from implanting regions of the semiconductor layer where source/drain regions will be later formed. However, the spin-applied resist layer, when formed, tends to be thicker where gate regions concentration is higher and tends to be thinner where gate regions concentration is lower. Therefore, after being etched back to expose the gate regions to the atmosphere, the spin-applied resist layer may be too thin where the pattern density of gate regions is lower to protect the semiconductor layer from the gate regions implantation.

As a result, there is a need for a structure (and method for forming the same), in which gate regions implantation essentially does not implant regions of the semiconductor layer where source/drain regions will be later formed.

SUMMARY OF THE INVENTION

The present invention provides a semiconductor structure fabrication method, comprising the steps of (a) providing (i) a semiconductor layer, (ii) a gate dielectric layer on the semiconductor layer, (iii) a gate region on the gate dielectric layer, wherein the gate region is electrically insulated from the semiconductor layer by the gate dielectric layer, and (iv) a proton-generating region on the gate region wherein the proton-generating region comprises free protons; (b) forming a resist layer on the gate dielectric layer and the proton-generating region; and (c) thermally diffusing free protons from the proton-generating region into the resist layer.

The present invention also provides a semiconductor structure fabrication method, comprising the steps of (a) providing (i) a semiconductor layer, (ii) a gate dielectric layer on the semiconductor layer, (iii) a gate region on the gate dielectric layer, wherein the gate region is electrically insulated from the semiconductor layer by the gate dielectric layer; (b) forming a resist layer on the gate dielectric layer and the gate region; (c) removing a cap portion of the resist layer directly above the gate region essentially in a direction perpendicular to an interfacial surface between the semiconductor layer and the gate dielectric layer; and (d) implanting the gate region essentially without implanting regions of the semiconductor layer.

The present invention also provides a semiconductor structure fabrication method, comprising the steps of (a) providing (i) a semiconductor layer, (ii) a gate dielectric layer on the semiconductor layer, (iii) a gate region on the gate dielectric layer, wherein the gate region is electrically insulated from the semiconductor layer by the gate dielectric layer; (b) forming a resist layer on the gate dielectric layer and the gate region; (c) removing the resist layer except a cap portion of the resist layer directly above the gate region essentially in a direction perpendicular to an interfacial surface between the semiconductor layer and the gate dielectric layer; (d) forming source/drain (S/D) protection regions on side walls of the gate region and the cap portion of the resist layer; (e) removing the cap portion of the resist layer; and (f) implanting the gate region through the space of the removed cap portion essentially without implanting regions of the semiconductor layer through the S/D protection regions.

The present invention also provides a structure (and method for forming the same), in which gate regions implantation essentially does not implant regions of the semiconductor layer where source/drain regions will be later formed.

DETAILED DESCRIPTION OF THE INVENTION

Figure 1A:
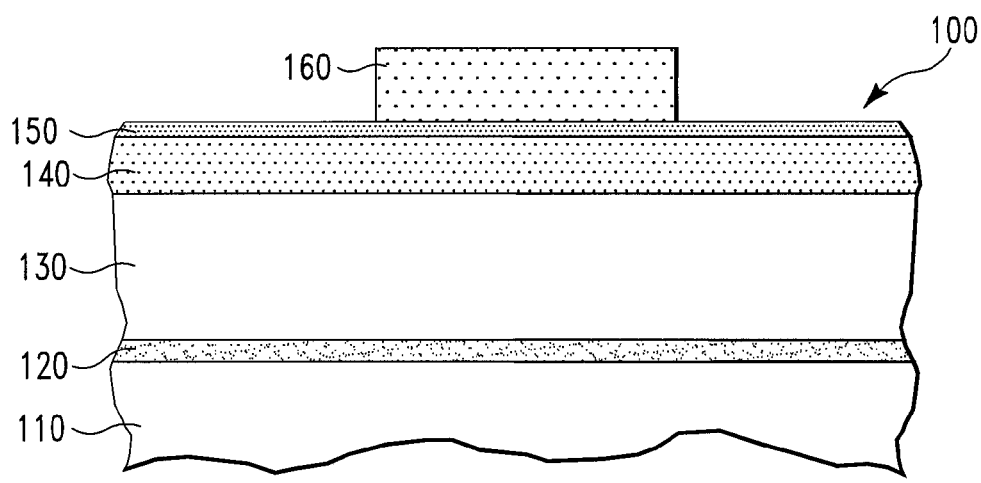
FIGS. 1-8 illustrate a first fabrication method for forming a semiconductor structure 100, in accordance with embodiments of the present invention.

FIGS. 1-8 illustrate a first fabrication method for forming a semiconductor structure 100, in accordance with embodiments of the present invention. More specifically, with reference to FIG. 1A, the first fabrication method for forming the semiconductor structure 100 can start out with a semiconductor (e.g., silicon, germanium, etc.) layer 110. Next, a gate dielectric layer 120 can be formed on top of the semiconductor layer 110. The gate dielectric layer 120 can comprise an oxide material (e.g., silicon dioxide) and can be formed on top of the semiconductor layer 110 by, illustratively, thermal oxidation. The gate dielectric may comprise a high k material (k is the dielectric constant) such as silicon nitride, silicon oxynitride, hafnium oxide, hafnium oxynitride, or other known dielectrics. Next, a gate layer 130 can be formed on top of the gate dielectric layer 120. The gate layer 130 can comprise poly-silicon and can be formed on top of the gate dielectric layer 120 by, illustratively, CVD (chemical vapor deposition).

Next, a proton-generating layer 140 can be formed on top of the gate layer 130. The proton-generating layer 140 can comprise a material that, when going through a chemical process, will generate free protons. In one embodiment, the proton-generating layer 140 can comprise a polymer that contains C—H (carbon-hydrogen) bond in which the H atom is replaceable. To generate free protons, the polymer can go through a chemical process called gas phase sulfonation during which the polymer chemically reacts with gaseous sulfur trioxide ($SO_3$) in a dry gas such as air, nitrogen, helium, carbon dioxide, or sulfur dioxide.

Figure 1B:
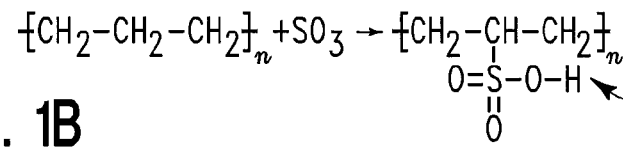

FIG. 1B illustrates the sulfonation of polyethylene (a polymer) that yields sulfonic acid as a product (to the right of the arrow). With reference to FIG. 1B, the H atom 170 is relatively free and can break free from the sulfonic acid molecule to become a free proton. This free proton, when placed in an electric field (not shown), will move in the same direction as that of the electric field. In one embodiment, the sulfonation of the polymer can be carried out at ambient conditions (i.e., 1 Atm pressure and 24° C. temperature) using a mixture of $SO_3$ and nitrogen (with $SO_3$ at 1% by volume).

Next, a cap layer 150 can be formed on top of the proton-generating layer 140. The cap layer 150 can comprise an oxide (e.g., silicon dioxide) or a nitride (e.g., silicon nitride). Next, a patterned resist layer 160 can be formed on top of the cap layer 150.

Figure 2:
Figure 2:
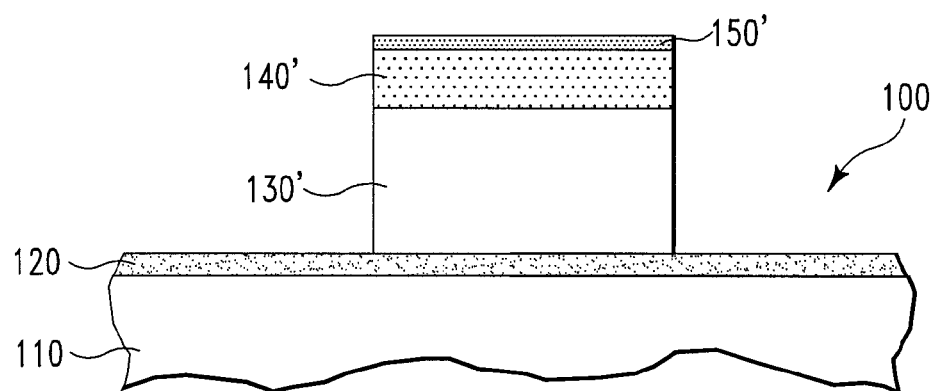

Next, the patterned resist layer 160 can be used as a mask to etch through the cap layer 150, the proton-generating layer 140, and the poly-silicon gate layer 130 in that order. Then, the patterned resist layer 160 can be removed. The resulting structure 100 after the patterned resist layer 160 is removed is shown in FIG. 2. Also, as a result of the etching process above, the cap layer 150, the proton-generating layer 140, and the poly-silicon gate layer 130 are reduced to the cap region 150', the proton-generating region (PGR) 140', and the poly-silicon gate region 130', respectively.

Next, with reference to FIG. 2, the cap region 150' can be removed. The resulting structure 100 after the cap region 150' is removed is shown in FIG. 3.

Figure 3:
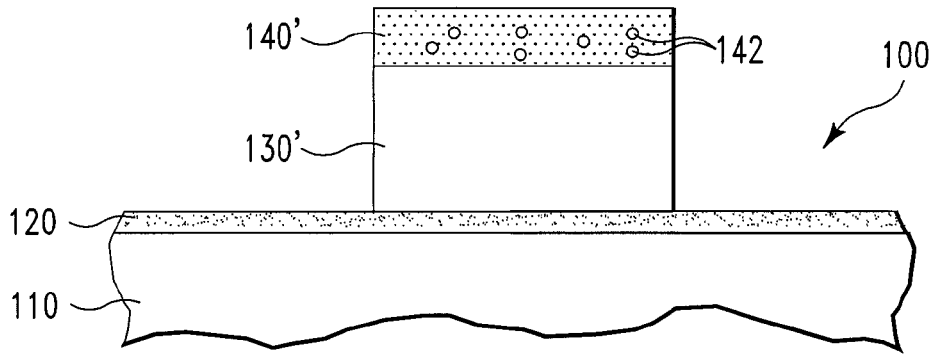

Next, with reference to FIG. 3, the proton-generating region 140' can be exposed to a chemical (not shown) so that free protons 142 are generated in the proton-generating region 140'. As described earlier, if the proton-generating region 140' comprises the organic polymer, then the proton-generating region 140' can be exposed to $SO_3$ so as to create the free protons 142 in the proton-generating region 140'.

Figure 4:
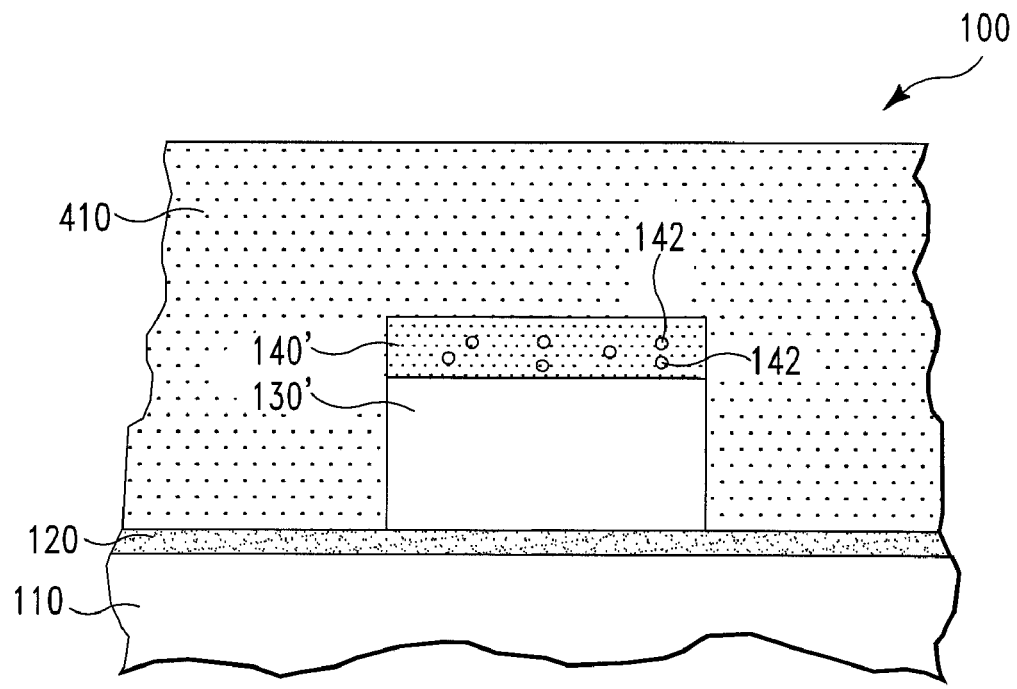

Next, with reference to FIG. 4, a resist layer 410 can be formed on top of the entire structure 100 of FIG. 3. The resist layer 410 can comprise a first material that, after being passed through by protons, becomes a second material such that there exists at least a first etching process that can etch away the second material essentially without etching the first material. The inventors of the present invention have found that most conventional positive photoresist materials can be used as the first material mentioned above because after being passed through by protons, these photoresist materials change characteristic (turning into the second material) and become soluble in a specific solvent (called developer). This developer can be used in the first etching process. This process is similar to a photolithography process except that no mask is used and a drift of protons is used instead of the radiation of light.

Figure 5:
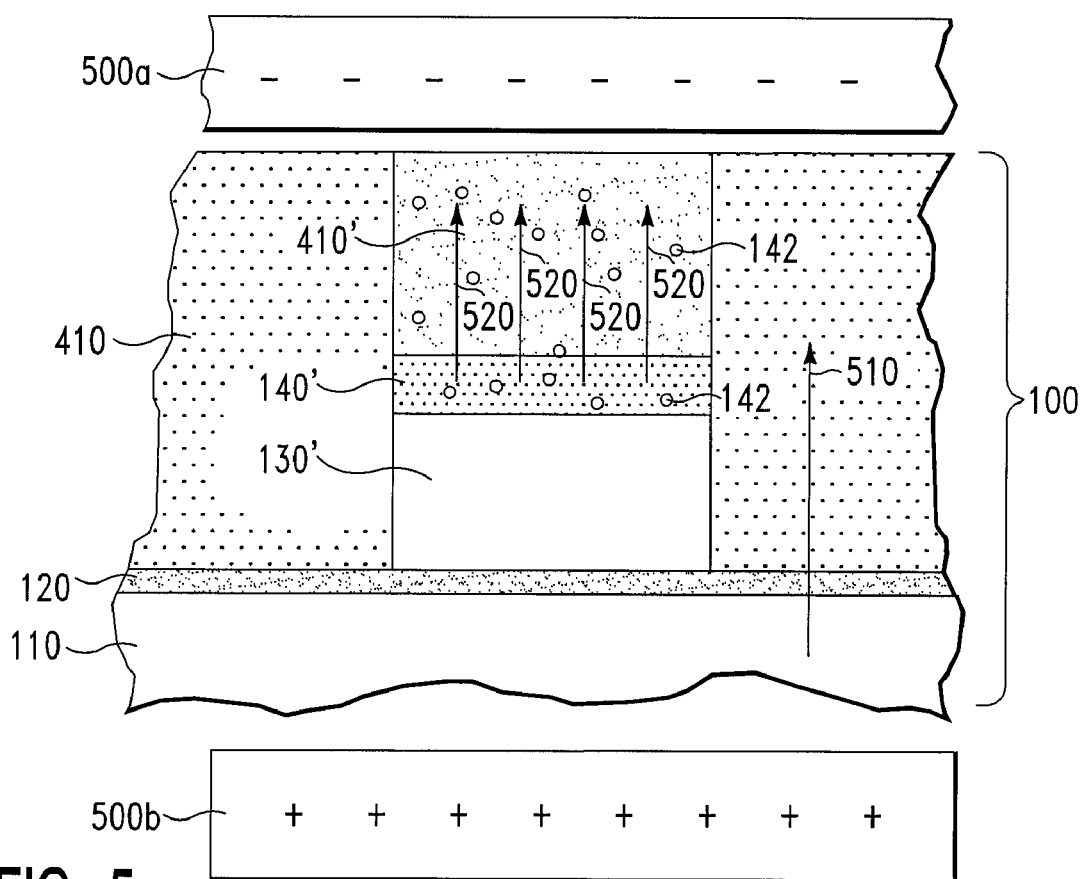

Next, with reference to FIG. 5, the structure 100 of FIG. 4 can be positioned in an electric field represented by an arrow 510 whose direction also indicates the direction of the electric field. Hereafter, the electric field can be referred to as the electric field 510. In one embodiment, the electric field 510 can be perpendicular to an interface surface 112 between the semiconductor layer 110 and the gate dielectric layer 120 and can point from the semiconductor layer 110 to the gate dielectric layer 120 as shown.

Placed in the electric field 510, the free protons 142 in the proton-generating region 140' move from the proton-generating region 140' through a cap portion 410' of the resist layer 410. The movements of the protons 142 are represented by arrows 520 whose directions also indicate the directions of the proton movements. As a result, if the resist layer 410 comprises the first material, then the cap portion 410' comprises the second material. In one embodiment, the electric field 510 can be provided by placing the structure 100 between cathode 500a and anode 500b as shown.

Figure 6:
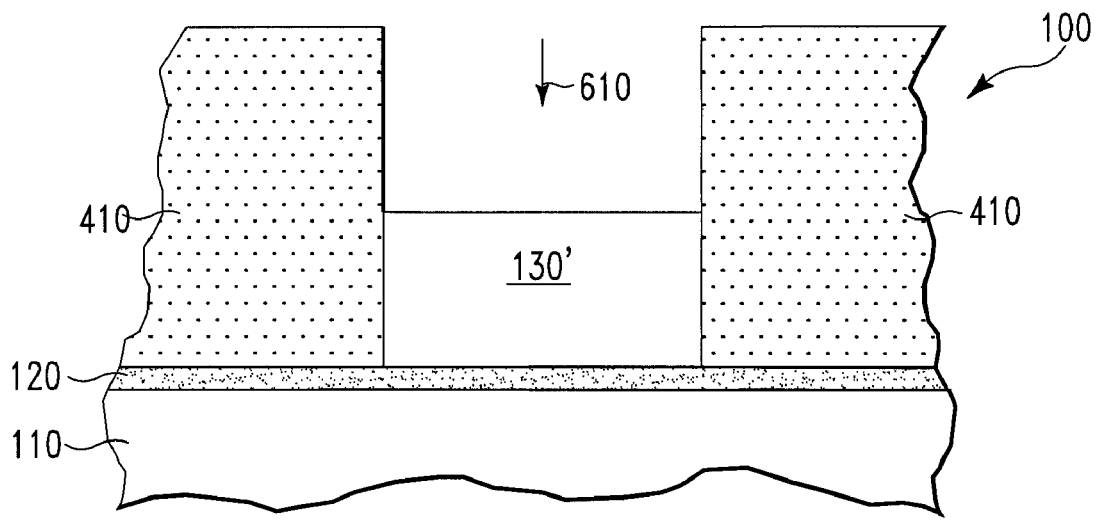

Next, the first etching process that can etch away the second material essentially without etching the first material can be performed to remove the cap portion 410' of the resist layer 410 essentially without removing the remainder of the resist layer 410. Next, the proton-generating region 140' can be removed. The resulting structure 100 is shown in FIG. 6. Alternatively, the proton-generating region 140' can be left in place because it does not significantly affects the ensuing doping of the gate region 130'.

Next, with reference to FIG. 6, a gate region implantation process can be performed to dope the gate region 130', but not the region of the semiconductor layer 110 directly beneath the gate region 130'. The gate region implantation process can be represented by arrow 610 whose direction also indicates the direction of gate region implantation ion bombardment. It should be noted that the remainder of the resist layer 410 (after the cap portion 410' of FIG. 5 is removed) is used as a blocking mask that prevents the gate region implantation ion bombardment of the gate region implantation process 610 from reaching regions of the semiconductor layer 110 directly beneath the remainder of the resist layer 410 (where source/drain regions will be formed).

Figure 7:
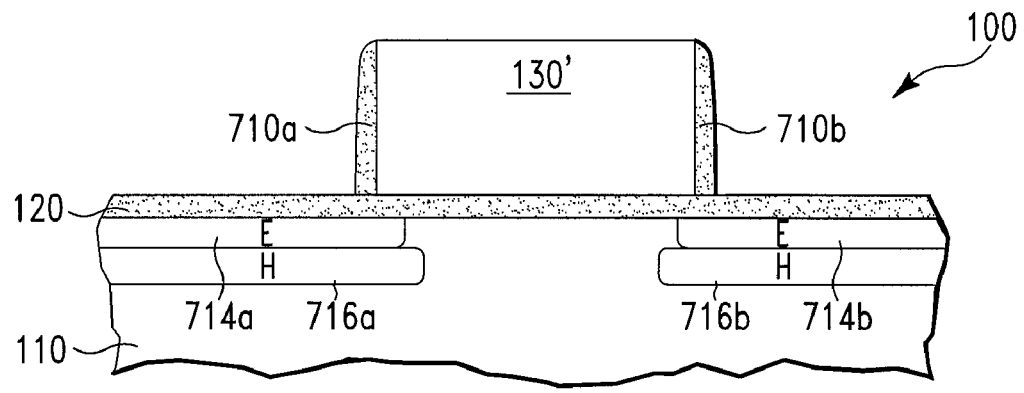

Next, with reference to FIG. 7, the remainder of the resist layer 410 can be removed. Then, two thin gate spacers 710a and 710b can be formed on side walls of the gate region 130'. The gate spacers 710a and 710b can comprise an oxide (e.g., silicon dioxide). Next, the gate region 130' and the gate spacers 710a and 710b can be used as a mask to implant the extension regions 714a and 714b, and then halo regions 716a and 716b, using any conventional method.

Figure 8:
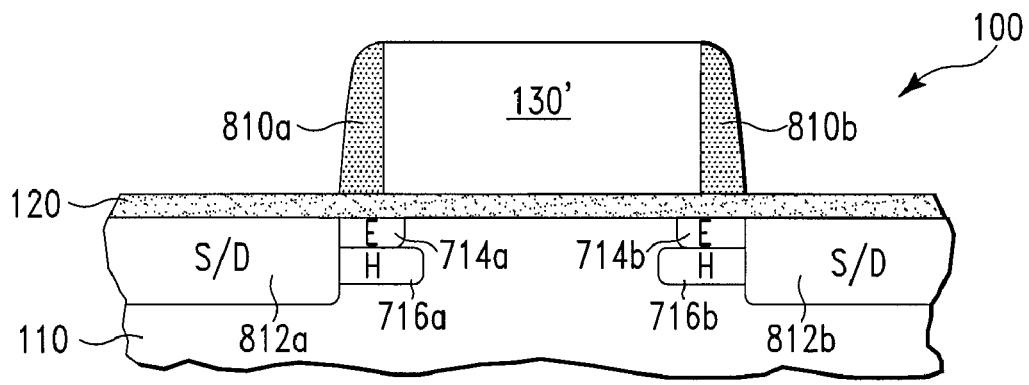
Figure 9:
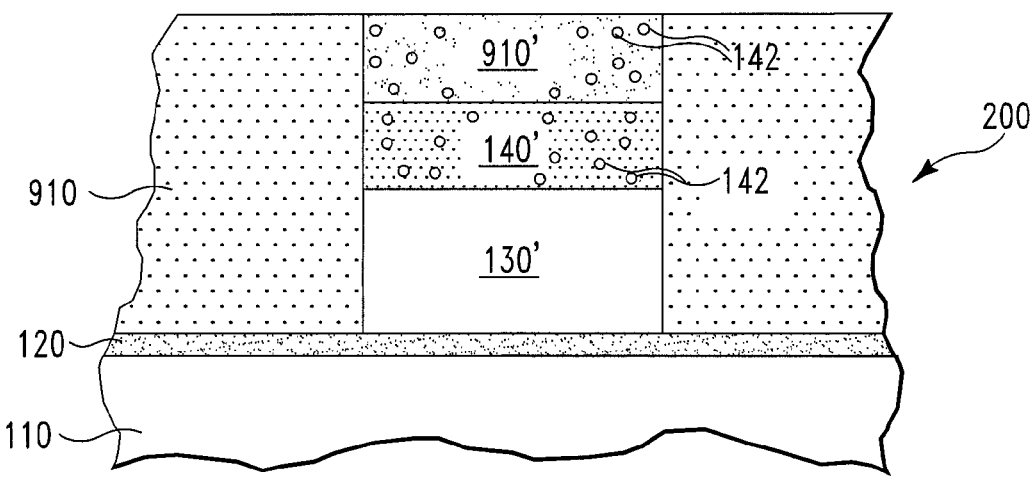
FIGS. 9-13 illustrate a second fabrication method for forming another semiconductor structure 200, in accordance with embodiments of the present invention.

Next, with reference to FIG. 8, two fat gate spacers 810a and 810b can be formed on side walls of the gate region 130'. In one embodiment, the gate spacers 810a and 810b can be formed by first depositing a conformal nitride layer (not shown) on top of the structure 100 of FIG. 7 and then removing the nitride from the horizontal surface by a directional etch. Alternatively, as can be seen in FIG. 8, the gate spacers 810a and 810b can be formed by first removing the gate spacers 710a and 710b of FIG. 7. Then, the gate spacers 810a and 810b can be formed by depositing a conformal nitride layer (not shown) on top of the structure 100 of FIG. 7 (with the gate spacers 710a and 710b having been removed) and then etching directionally the deposited nitride layer so as to form the gate spacers 810a and 810b. Next, the gate region 130' and the gate spacers 810a and 810b can be used as a mask to implant source/drain (S/D) regions 812a and 812b.

FIGS. 9-13 illustrate a second fabrication method for forming another semiconductor structure 200, in accordance with embodiments of the present invention. More specifically, with reference to FIG. 9, the second fabrication method for forming the semiconductor structure 200 can start out with a structure similar to the structure 100 of FIG. 5 except that the resist layer 910 can comprise a third material that, after being passed through by protons 142, becomes a fourth material such that there exists at least a second etching process that can etch away the third material essentially without etching the fourth material. As a result after being passed through by protons 142, the cap portion 910' of the resist layer 910 essentially comprises the fourth material. The inventors of the present invention have found that most conventional negative photoresist materials can be used as the third material mentioned above because after being passed through by protons, these photoresist materials change characteristic (turning into the fourth material) and become insoluble in a specific solvent (called developer). This developer can be used in the second etching process. This process is similar to a photolithography process except that no mask is used and a drift of protons is used instead of the radiation of light.

Next, the second etching process, that can etch away the third material essentially without etching the fourth material, can be used to etch away the resist layer 910 except the cap portion 910' of the resist layer 910.

Figure 10:
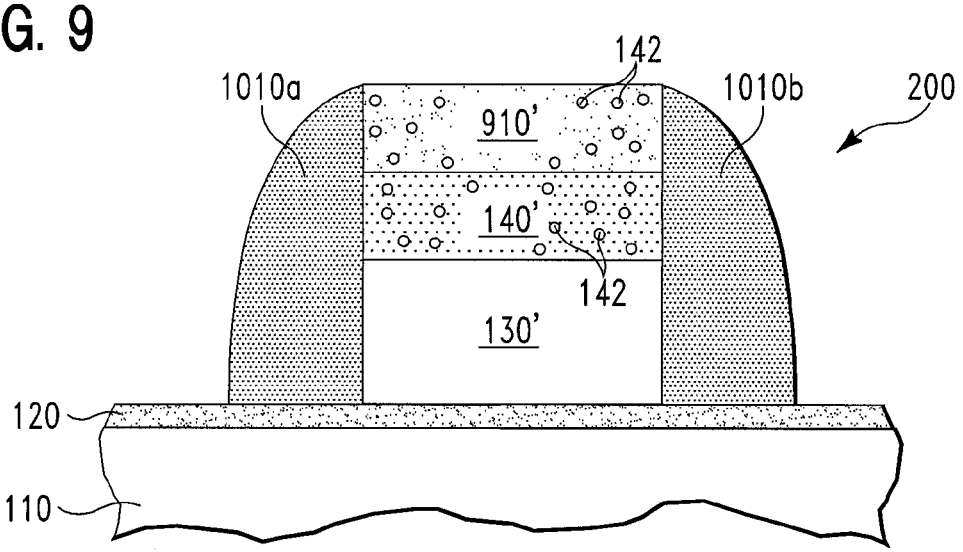
Figure 11:
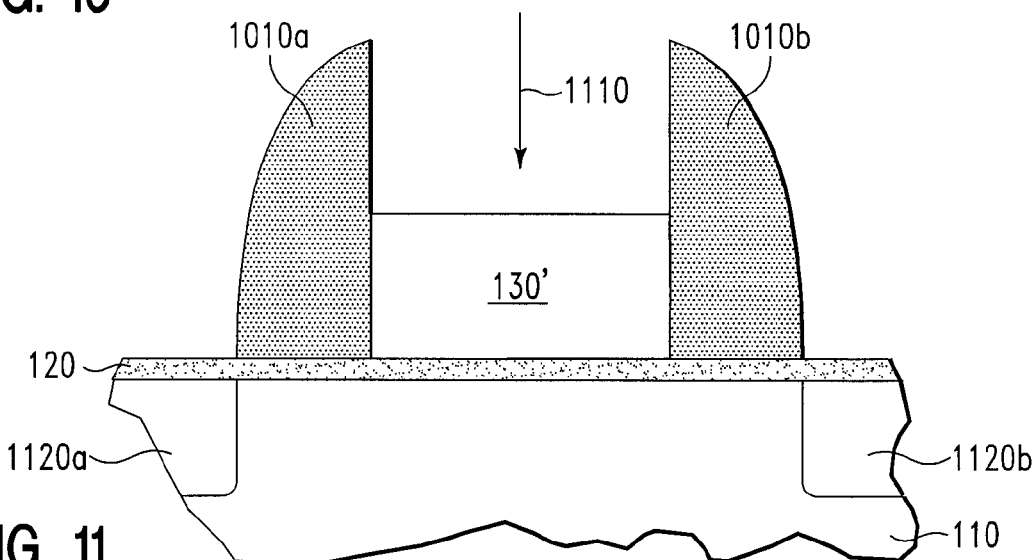

Next, with reference to FIG. 10, S/D protection spacers 1010a and 1010b can be formed on side walls of the gate stack 130',140',910' comprising the cap portion 910', the proton-generating region 140', and the gate region 130'. The S/D protection spacers 010a and 1010b can be formed by plasma assisted deposition of a conformal nitride (e.g., silicon nitride) or oxide (e.g., silicon dioxide) followed by directional etching of nitride or oxide. Next, the cap portion 910' and then the proton-generating region 140' can be in turn removed. The resulting structure 200 is shown in FIG. 11. Alternatively, the proton-generating region 140' can be left in place because it does not significantly affects the ensuing doping of the gate region 130'.

Next, with reference to FIG. 11, a gate region implantation process can be performed to dope the gate region 130', but not the region of the semiconductor layer 110 directly beneath the gate region 130'. The gate region implantation process can be represented by arrow 1110 whose direction also indicates the direction of gate region implantation ion bombardment. It should be noted that the S/D protection spacers 1010a and 1010b can be used as a blocking mask that prevents the gate region implantation ion bombardment 1110 from reaching regions of the semiconductor layer 110 directly beneath the S/D protection spacers 1010a and 1010b (where source/drain regions will be formed).

Regions 1120a and 1120b of the semiconductor layer 110 are inadvertently doped by the gate region implantation process 1110. However, as can be seen later, the doped regions 1120a and 1120b do not adversely affect the operation of the final device 200 of FIG. 13.

Figure 12:
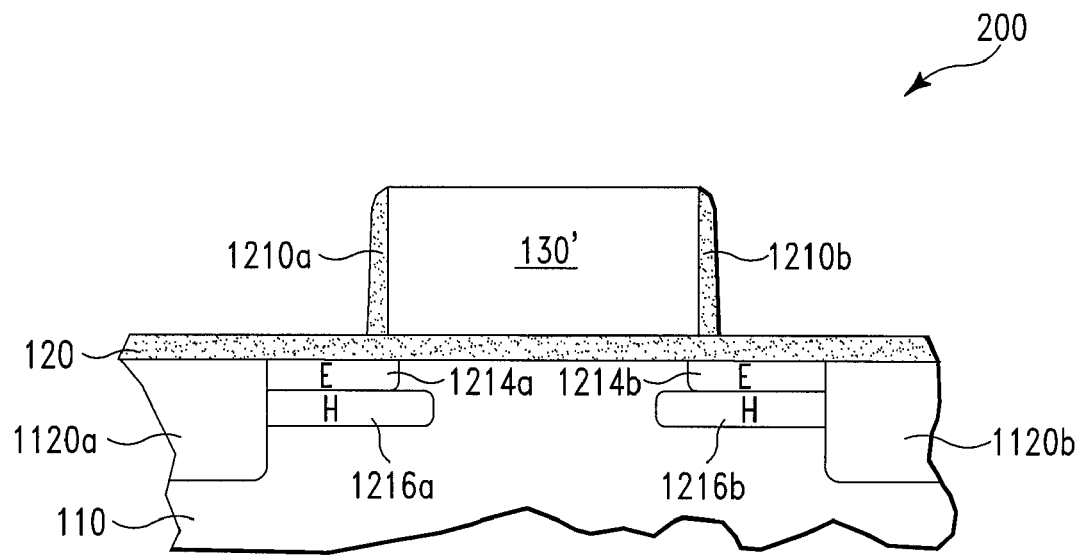

Next, with reference to FIG. 12, the S/D protection spacers 1010a and 1010b (FIG. 11) can be removed. Then, two thin gate spacers 1210a and 1210b can be formed on side walls of the gate region 130'. The gate spacers 1210a and 1210b can comprise an oxide (e.g., silicon dioxide). Next, the gate region 130' and the gate spacers 1210a and 1210b can be used as a mask to implant the extension regions 1214a and 1214b, and then halo regions 1216a and 1216b, using any conventional method.

Figure 13:
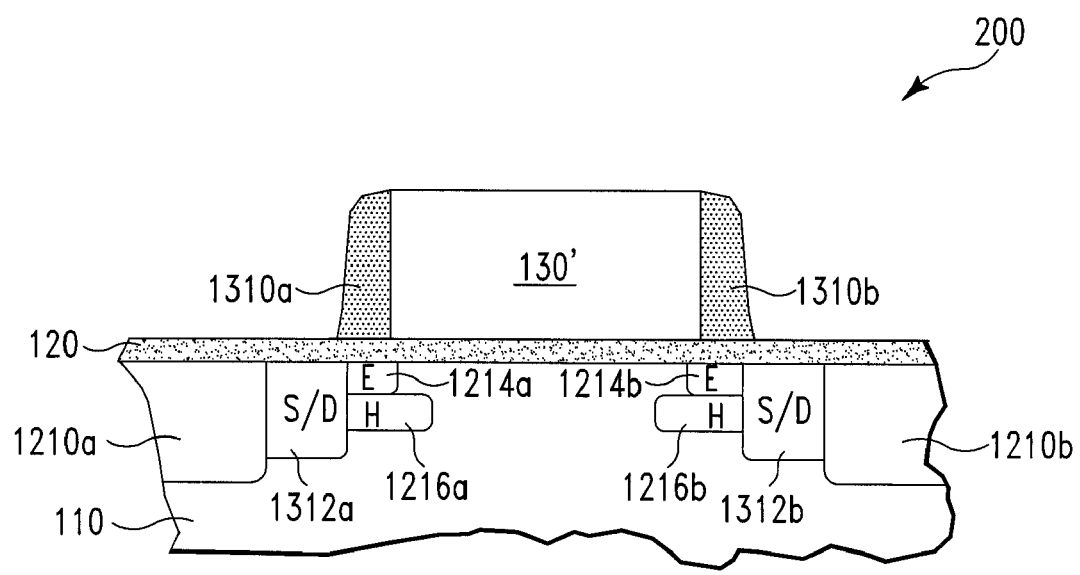

Next, with reference to FIG. 13, two thicker gate spacers 1310a and 1310b can be formed on side walls of the gate region 130'. In one embodiment, the gate spacers 1310a and 1310b can be formed by first depositing a conformal nitride layer (not shown) on top of the structure 200 of FIG. 12 and then removing the nitride from the horizontal surface by a directional etch. Alternatively, as can be seen in FIG. 13, the gate spacers 1310a and 1310b can be formed by first removing the thin gate spacers 1210a and 1210b of FIG. 12. Then, the thick gate spacers 1310a and 1310b can be formed by depositing a conformal nitride layer (not shown) on top of the structure 200 of FIG. 12 (with the thin gate spacers 1210a and 1210b having been removed) and then etching directionally the deposited nitride layer so as to form the thick gate spacers 1310a and 1310b.

Then, the gate region 130' and the gate spacers 1310a and 1310b can be used as a mask to implant source/drain (S/D) regions 1312a and 1312b.

In summary, the first and second methods of the present invention form S/D protection regions directly above the regions of the semiconductor layer 110 where S/D regions will be later formed, while exposing the poly-silicon gate regions to the atmosphere. As a result, the gate regions implantation process can be tailored to dope the gate regions essentially without doping the regions of the semiconductor layer 110 where S/D regions will be later formed.

Figure 14A:
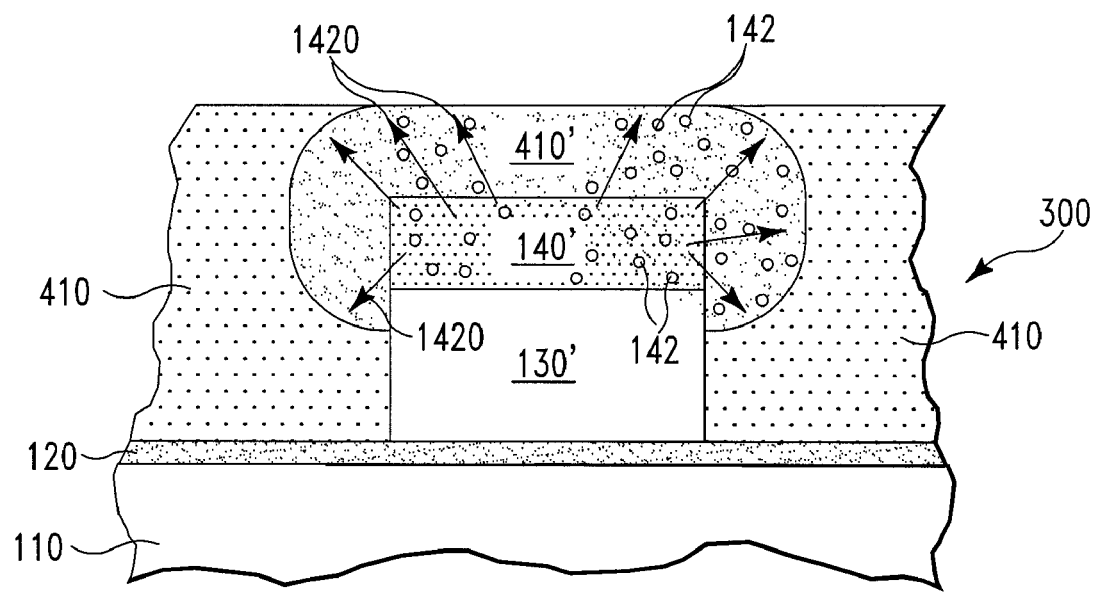
FIGS. 14A-14B illustrate a third fabrication method, in accordance with embodiments of the present invention.
Figure 14B:
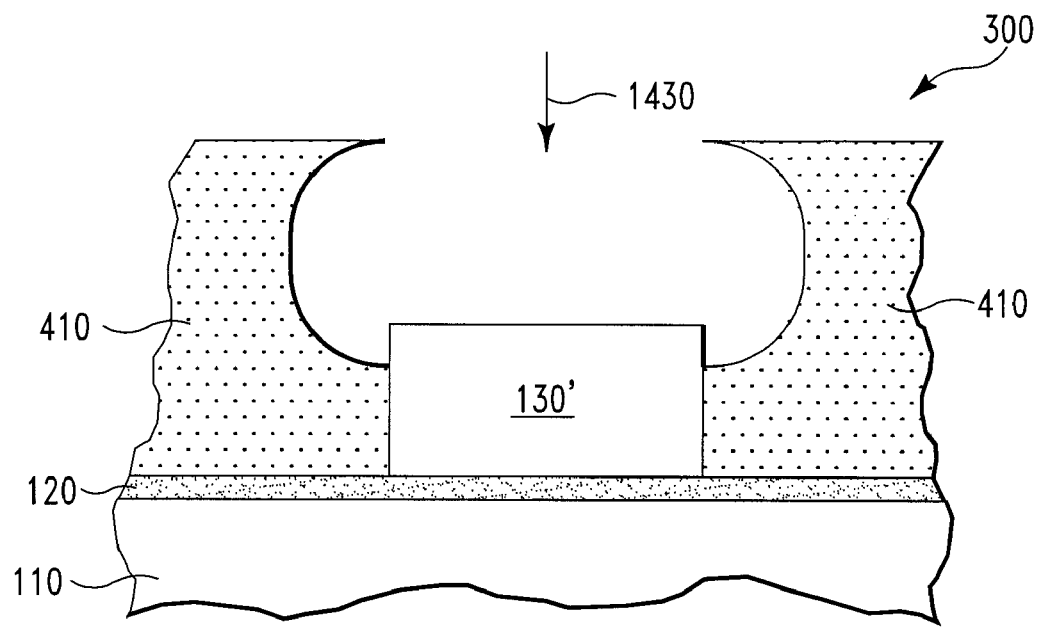

FIGS. 14A-14B illustrate a third fabrication method for forming the semiconductor structure 300, in accordance with embodiments of the present invention. The third fabrication method is similar to the first fabrication method (illustrated in FIGS. 1-8). With reference to FIG. 14A, after the resist layer 410 is formed on top of the entire structure 300, the structure 300 is similar to the structure 100 of FIG. 4. Next, the PGR region 140' is subjected to heat that diffuses the free protons 142 of the PGR region 140' into in the resist layer 410 to form the cap portion 410'. The thermal proton diffusion is represented by arrows 1420 whose directions also indicate the directions of the proton diffusion into the resist layer 410. As a result, while the cap portion 410' of FIG. 5 (the first fabrication method) is only directly above the PGR region 140', the cap portion 410' of FIG. 14A is not only directly above but also surrounds the PGR region 140'. Next, the cap portion 410' can be removed (by etching) essentially without removing the remainder of the resist layer 410. Next, the proton-generating region 140' can be removed. The resulting structure 300 is shown in FIG. 14B. Alternatively, the proton-generating region 140' can be left in place because it does not significantly affects the ensuing doping of the gate region 130'.

Next, with reference to FIG. 14B, the third fabrication method proceeds with a gate region implantation process to dope the gate region 130', but not the region of the semiconductor layer 110 directly beneath the gate region 130'. The gate region implantation process can be represented by arrow 1430 whose direction also indicates the direction of gate region implantation ion bombardment. It should be noted that the remainder of the resist layer 410 (after the cap portion 410' of FIG. 14A is removed) is used as a blocking mask that prevents the gate region implantation ion bombardment of the gate region implantation process 1430 from reaching regions of the semiconductor layer 110 directly beneath the remainder of the resist layer 410 (where source/drain regions will be formed). After this gate region implantation process, the third fabrication method is similar to the first fabrication method.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure fabrication method, comprising:

providing a semiconductor structure which includes (i) a semiconductor layer, (ii) a gate dielectric layer on the semiconductor layer, and (iii) a gate electrode region on the gate dielectric layer, wherein the gate dielectric layer is sandwiched between and electrically insulates the semiconductor layer and the gate electrode region, and wherein the semiconductor layer and the gate dielectric layer share a common interfacing surface which defines a reference direction perpendicular to the common interfacing surface and pointing from the semiconductor layer to the gate dielectric layer;

forming a resist layer on the gate dielectric layer and the gate electrode region; and removing a cap portion of the resist layer directly above the gate electrode region in the reference direction without removing any portion of the resist layer not directly above the gate electrode region in the reference direction, wherein, before said removing the cap portion is performed, the resist layer including the cap portion comprises a first material, wherein said removing the cap portion comprises:
changing the first material of the cap portion to a second material, and
applying an etching process to the resist layer including to the cap portion that etches away the second material but leaves the first material intact resulting in the cap portion which comprises the second material being removed whereas other portions of the resist layer which comprise the first material being essentially intact, wherein said changing the first material of the cap portion to the second material comprises sending protons through the cap portion resulting in the first material of the cap portion becoming the second material, wherein the semiconductor structure further includes a proton-generating region on the gate electrode region such that after said forming the resist layer is performed, the proton-generating region is sandwiched between the gate electrode region and the resist layer, wherein said sending the protons through the cap portion comprises:
exposing the proton-generating region to a chemical resulting in free protons being generated in the proton-generating region, and
applying an electric field to the free protons resulting in the free protons moving through the cap portion.

* * * * *